(12) United States Patent
Wu et al.

(10) Patent No.: US 8,391,096 B2
(45) Date of Patent: Mar. 5, 2013

(54) POWER SUPPLY SYSTEM FOR MEMORIES

(75) Inventors: Kang Wu, Shenzhen (CN); Bo Tian, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/302,940

(22) Filed: Nov. 22, 2011

(65) Prior Publication Data
US 2013/0016578 A1    Jan. 17, 2013

(30) Foreign Application Priority Data
Jul. 13, 2011    (CN) .......................... 2011 1 0195312

(51) Int. Cl.
*G11C 5/14*    (2006.01)
(52) U.S. Cl. ........................................ 365/226; 365/227
(58) Field of Classification Search .................. 365/226, 365/227
See application file for complete search history.

(56) References Cited

U.S. PATENT DOCUMENTS

| | | | |
|---|---|---|---|
| 6,351,827 B1 * | 2/2002 | Co et al. .......................... 714/42 |
| 6,894,691 B2 * | 5/2005 | Juenger .......................... 345/531 |
| 7,366,929 B1 * | 4/2008 | Mimberg ........................ 713/310 |
| 7,587,559 B2 * | 9/2009 | Brittain et al. ................. 711/154 |
| 7,804,733 B2 * | 9/2010 | Alexander et al. ............. 365/226 |
| 8,054,676 B2 * | 11/2011 | Tanguay et al. ................ 365/149 |
| 2010/0138675 A1 * | 6/2010 | Nikazm et al. ................. 713/300 |
| 2010/0250973 A1 * | 9/2010 | Breen et al. .................... 713/300 |
| 2011/0051479 A1 * | 3/2011 | Breen et al. .................... 363/148 |
| 2011/0153903 A1 * | 6/2011 | Hinkle et al. .................. 710/313 |
| 2011/0185208 A1 * | 7/2011 | Iwamoto et al. ............... 713/323 |
| 2011/0286288 A1 * | 11/2011 | Mutnury et al. .......... 365/189.09 |

* cited by examiner

*Primary Examiner* — Viet Q Nguyen
(74) *Attorney, Agent, or Firm* — Altis Law Group, Inc.

(57) ABSTRACT

A power supply system for memory modules includes a control unit and a voltage regulator. The control unit includes a basic input/output system (BIOS) and a control chip connected to the BIOS. The BIOS controls the control chip to output a control signal according to the number of the memory modules mounted in memory slots. The voltage regulator is connected to the control chip through first and second general purpose input/output (GPIO) buses. The voltage regulator receives the control signal from the control chip through the first and second GPIO buses and regulates power supply modes, to output different phase voltages to the memory modules mounted in the memory slots.

6 Claims, 2 Drawing Sheets

POWER SUPPLY SYSTEM FOR MEMORIES

BACKGROUND

1. Technical Field

The present disclosure relates to a power supply system for memories.

2. Description of Related Art

Many memory modules are mounted in memory slots in a computer system for adding storage capacity. These memory modules receive voltage from a voltage regulator arranged on a motherboard of the computer system through the memory slots. However, the voltage regulator will provide full multiphase power to these memory slots, which may not be fully utilized, thus wasting energy. Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the drawings, is illustrated by way of example and not by way of limitation. References to "an" or "one" embodiment in this disclosure are not necessarily to the same embodiment, and such references mean at least one.

Figure 1:
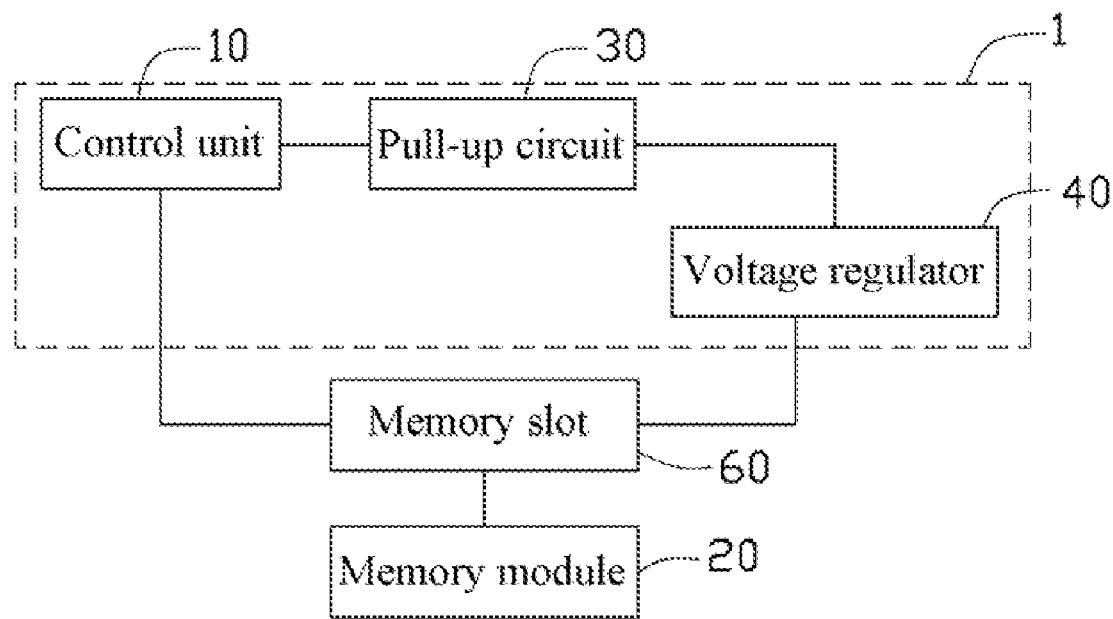
FIG. 1 is a block diagram of a power supply system for memories in accordance with an exemplary embodiment of the present disclosure.

Referring to FIG. 1, a power supply system 1 is used for providing voltages to memory modules 20 which are mounted in memory slots 60 of a motherboard (not shown). The power supply system 1 in accordance with an exemplary embodiment includes a control unit 10, a pull-up circuit 30, and a voltage regulator 40. The control unit 10 is connected between the memory slots 60 and the pull-up circuit 30. The voltage regulator 40 is connected between the memory slots 60 and the pull-up circuit 30.

Figure 2:
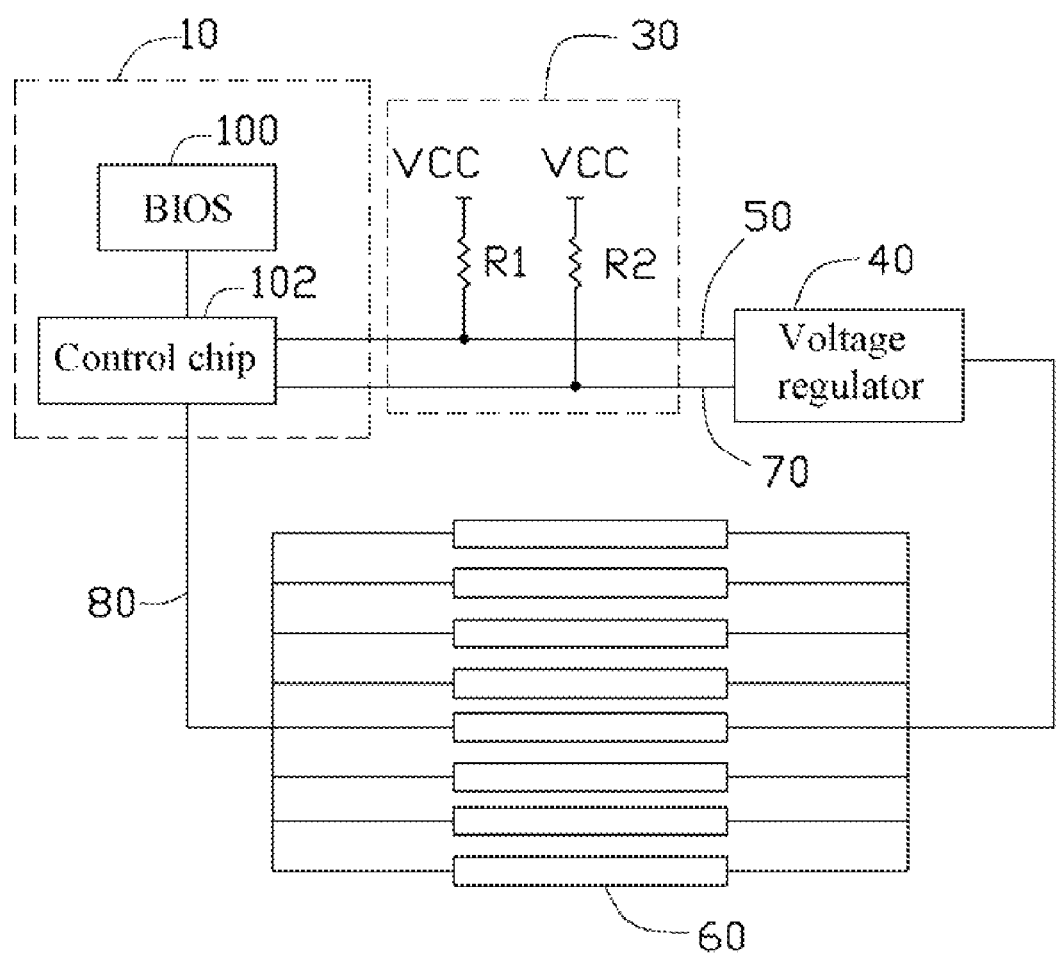
FIG. 2 is a circuit diagram of the power supply system of FIG. 1.

Referring to FIG. 2, in one embodiment, the memory slots 60 include eight dual in-line memory module (DIMM) memory slots. The control unit 10 includes a basic input/output system (BIOS) 100 and a control chip 102 connected to the BIOS 100. The control chip 102 is a platform controller hub (PCH) chip or a south bridge chip. The control chip 102 outputs a control signal to the voltage regulator 40 through first and second general purpose input/output (GPIO) buses 50 and 70. The control chip 102 reads information, such as storage capacity, frequencies, types, and locations of the memory modules 20, which are mounted in the memory slots 60 through a system management bus (SMBus) 80. The information of the memory modules 20 can be displayed, for conveniently regulating power supply modes of the voltage regulator 40 by the BIOS 100.

The pull-up circuit 30 includes resistors R1 and R2. First ends of the resistors R1 and R2 are connected to a power source VCC, and second ends of the resistors R1 and R2 are respectively connected to the first and second GPIO buses 50 and 70. When the first and second GPIO buses 50 and 70 receive high level signals, the resistors R1 and R2 stabilize the high level signals from the control chip 102 to the voltage regulator 40. In other embodiments, the pull-up circuit 30 is not inserted to save cost if stabilizing is not needed for the application.

In use, power supply modes of the voltage regulator 40 can be regulated by the BIOS 100. For example, when the number of the memory modules 20 mounted in the memory slots 60 is less than 3, the power supply mode of the voltage regulator 40 is regulated to a one-phase power mode. When the number of the memory modules 20 mounted in the memory slots 60 is greater than 3 and less than 6, the power supply mode of the voltage regulator 40 is regulated to a two-phase power mode. When the number of the memory modules 20 mounted in the memory slots 60 is greater than 6, the power supply mode of the voltage regulator 40 is regulated to a full multiphase power mode.

When the voltage regulator 40 are regulated to the one-phase power mode by the BIOS 100, the control chip 102 outputs low level signals to the voltage regulator 40 through the first and second GPIO buses 50 and 70. Thus, the voltage regulator 40 outputs one-phase power to the memory modules 20 mounted in the memory slots 60. When the voltage regulator 40 is regulated to the two-phase power mode by the BIOS 100, the control chip 102 outputs a low level signal and a high level signal to the voltage regulator 40 respectively through the first and second GPIO buses 50 and 70. Thus, the voltage regulator 40 outputs two-phase power to the memory modules 20 mounted in the memory slots 60. When the voltage regulator 40 is regulated to the full multiphase power mode by the BIOS 100, the control chip 102 outputs high level signals to the voltage regulator 40 through the first and second GPIO buses 50 and 70. Thus, the voltage regulator 40 outputs full multiphase power to the memory modules 20 mounted in the memory slots 60. In a default power mode of the voltage regulator 40, namely, the power supply mode of the voltage regulator 40 not regulated by the BIOS 100, the control chip 102 outputs high level signals to the voltage regulator 40 through the first and second GPIO buses 50 and 70, namely, the voltage regulator 40 outputs full multiphase power to the memory modules 20 mounted in the memory slots 60.

The power supply system 1 can control the power supply modes of the voltage regulator 40 by the BIOS 100, to make the voltage regulator 40 output different voltages to the memory modules 20 according to the number of the memory modules 20 mounted in the memory slots 60. Therefore, the power supply system 1 saves energy.

Even though numerous characteristics and advantages of the disclosure have been set forth in the foregoing description, together with details of the structure and function of the disclosure, the disclosure is illustrative only, and changes may be made in detail, especially in matters of shape, size, and the arrangement of parts within the principles of the disclosure to the full extent indicated by the broad general meaning of the terms in which the appended claims are expressed.

What is claimed is:

1. A power supply system applicable to memory modules mounted in memory slots, the power supply system comprising:

a control unit comprising a basic input/output system (BIOS) and a control chip connected to the BIOS and the memory slots, wherein the BIOS controls the control chip to output a control signal according to the number of the memory modules mounted in the memory slots; and a voltage regulator connected to the control chip through first and second general purpose input/output (GPIO) buses, wherein the voltage regulator receives the control signal from the control chip through the first and second GPIO buses and regulates power supply modes, to output different phase voltages to the memory modules mounted in the memory slots;

wherein when the number of the memory modules mounted in the memory slot is less than 3, the power supply modes of the voltage regulator is regulated to a one-phase power mode by the BIOS; when the number of the memory module mounted in the memory slot is greater than 3 and less than 6, the power supply modes of the voltage regulator is regulated to a two-phase power mode by the BIOS; when the number of the memory module mounted in the memory slot is greater than 6, the power supply modes of the voltage regulator is regulated to a full multiphase power mode by the BIOS.

2. The power supply system of claim 1, further comprising a pull-up circuit, wherein the pull-up circuit comprises at least one resistor, a first end of the at least one resistor is connected to a power source, and a second end of the at least one resistor is connected to at least one of the GPIO bus.

3. The power supply system of claim 1, wherein the control chip is a platform controller hub.

4. The power supply system of claim 1, wherein the control chip is a south bridge chip.

5. The power supply system of claim 1, wherein the memory slots are dual in-line memory module memory slots.

6. A power supply system applicable to memory modules mounted in memory slots, the power supply system comprising:

a control unit comprising a basic input/output system (BIOS) and a control chip connected to the BIOS and the memory slots, wherein the BIOS controls the control chip to output a control signal according to the number of the memory modules mounted in the memory slots;

a voltage regulator connected to the control chip through first and second general purpose input/output (GPIO) buses, wherein the voltage regulator receives the control signal from the control chip through the first and second GPIO buses and regulates power supply modes, to output different phase voltages to the memory modules mounted in the memory slots; and a pull-up circuit, wherein the pull-up circuit comprises at least one resistor, a first end of the at least one resistor is connected to a power source, and a second end of the at least one resistor is connected to at least one of the GPIO bus.

* * * * *